(12) United States Patent
De Winter et al.

(10) Patent No.: US 7,352,443 B2
(45) Date of Patent: Apr. 1, 2008

(54) RADIALLY POLARIZED LIGHT IN LITHOGRAPHIC APPARATUS

(75) Inventors: Laurentius Cornelius De Winter, Vessem (NL); Michel Fransois Hubert Klaassen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 2 days.

(21) Appl. No.: 11/266,497

(22) Filed: Nov. 4, 2005

(65) Prior Publication Data
US 2006/0109446 A1 May 25, 2006

Related U.S. Application Data

(63) Continuation-in-part of application No. 10/981,728, filed on Nov. 5, 2004, now abandoned.

(51) Int. Cl.
*G03B 27/72* (2006.01)
*G03B 27/54* (2006.01)
(52) U.S. Cl. .......................................... 355/71; 355/67
(58) Field of Classification Search ................ 355/53, 355/67, 71; 359/649
See application file for complete search history.

(56) References Cited

U.S. PATENT DOCUMENTS

| | | | |
|---|---|---|---|
| 2001/0019404 A1* | 9/2001 | Schuster et al. | ............... 355/67 |
| 2003/0020893 A1* | 1/2003 | Kawashima | .................. 355/67 |
| 2004/0180294 A1* | 9/2004 | Baba-Ali et al. | ............ 430/311 |
| 2005/0146704 A1* | 7/2005 | Gruner et al. | ................. 355/71 |

OTHER PUBLICATIONS

Nabila Baba-Ali et al., "Overcoming the Resolution Challenge Using Special Illumination Techniques to Print 50/50 nm Nested Contact Holes at 157 nm Wavelength", Optical Microlithography XVI, Proceedings of SPIE, vol. 5040, p. 1352-1362, (2003).

* cited by examiner

*Primary Examiner*—Henry Hung Nguyen
(74) *Attorney, Agent, or Firm*—Pillsbury Winthrop Shaw Pittman LLP

(57) ABSTRACT

The present invention relates to a lithographic apparatus and a method of using the apparatus in the manufacture of a device such as an integrated circuit (IC). In particular, the present invention relates to a lithographic apparatus designed to be used with radiation having a wavelength in the Deep Ultra-Violet (DUV) and wherein radially polarized light is used to enhance the image contrast. In particular the present invention relates to partial clipping of the first order.

33 Claims, 13 Drawing Sheets

RADIALLY POLARIZED LIGHT IN LITHOGRAPHIC APPARATUS

RELATED APPLICATIONS

The present application is a continuation-in-part of U.S. application Ser. No. 10/981,728, filed Nov. 5, 2004 which is now abandoned, the entire contents of which is hereby incorporated by reference.

FIELD

The present invention relates to a lithographic apparatus and a method of using the apparatus, for example in the manufacture of a device such as an integrated circuit (IC).

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Between the reticle and the substrate is disposed a projection system for imaging the irradiated portion of the reticle onto the target portion of the substrate. The projection system includes components for directing, shaping or controlling the projection beam of irradiation, and these components typically include refractive optics, reflective optics, and/or catadioptric systems, for example.

Generally, imaging of Phase Shift Mask (PSM) structures uses an on-axis pupil filling with a low pupil filling factor (i.e. σ) of less than 0.4. This allows very small pitches and/or critical dimensions approaching $k_1$=0.25 to be used. An important feature of these prior art un-polarized on-axis settings in combination with PSM structures is that it allows imaging of dense features in many orientations during the same exposure. The resolution that can be printed by a lithographic machine is often expressed by the $k_1$ value. The $k_1$ value relates the resolution R that can be printed to the wavelength λ and the numerical aperture NA of the machine by $R=k_1\lambda/NA$.

However, when the pitch of the PSM features become smaller, such as less than the wavelength divided by twice the numerical aperture, then a portion of the first order (of diffracted radiation) falls outside the numerical aperture (i.e. NA). This has the disadvantage of rapidly decreasing the image contrast.

SUMMARY

According to an aspect of the invention, there is provided a lithographic apparatus including an illumination system configured to condition a radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate, wherein the radiation beam is substantially radially polarized which has the effect of improving the image contrast.

The Degree Of Radial Polarization (DORP) is expressed herein as the normalized integral over the polarization vectors projected on the radial direction. This can be written as (E is the E-field vector, r the pupil co-ordinate):

$$DORP = \frac{\int\int_\Sigma \vec{E}(\vec{r}) \cdot \hat{r} \, d\vec{r}}{\sqrt{\int\int_\Sigma \vec{E}(\vec{r}) \cdot \vec{E}(\vec{r}) \, d\vec{r}}}$$

The DORP is 1 for a real radial polarization, 0.5 for un-polarized illumination, 0 for tangential polarization and 0.9 for x- and y-polarization in 4 quadrants. The term radial polarization is used herein for any illumination mode for which the DORP is larger than 0.5.

Typically, the radiation beam may be more than about 50%, 60%, 70%, 80%, 90% or 95% polarized. Preferably, the radiation beam may be more than about 80% radially polarized.

Typically, using radially polarized on-axis illumination allows the image contrast to be improved thereby allowing dense features to be formed. The radial direction of the polarization direction may be achieved by positioning a polarization direction shaping element, or polarizing optical element, in the pupil plane of the illuminator of the lithographic apparatus. The polarization direction shaping element or polarizing optical element may consist of spatially separated elements that can change the direction of the E-field vector independently from each other. These elements may be retarding elements, optical active elements or polarizing elements. An important aspect of this polarization distribution is that it can be used (unlike x- or y-polarization) for both horizontal (H) and vertical (V) lines.

Using radially polarized illumination allows $k_1$ values down to less than about 0.5, 0.4, 0.3 or 0.28 (assuming that the minimal spot size in the pupil has a radius of 0.15) to be formed Typically, the radially polarized illumination may be of any suitable shape such as, for example, diamond, circular, star-shaped or rectangularly shaped on-axis illumination.

Typically, the first order (of diffracted radiation) may be clipped by a numerical aperture diaphragm with an amount of about 40%, 30%, 20%, 10% or 5% being clipped. Conveniently, the first order is clipped by about 5-40% or 10-20%. Preferably, the first order may be clipped by about 12.5%. This leads to an improvement in the image contrast. When using radial polarization if a small part of the spectrum falls outside the numerical aperture, this will lead to an enhancement in the image contrast.

Typically, the numerical aperture may be tuned to enhance the image contrast with a value (depending on application, for instance immersion or dry) between about 5 and 30% (in absolute sense). In certain embodiments, the numerical aperture may comprise a variable numerical aperture diaphragm.

Typically, the radiation used in the lithographic apparatus may have a wavelength corresponding to that of Deep Ultra-Violet (DUV). The radiation used may have a wavelength of between about 50-500 nm or about 100-400 nm. Preferred wavelengths are about 157 nm, 193 nm, 248 nm or 365 nm.

According to a further aspect of embodiments of the present invention there is provided a lithographic apparatus wherein a substantially radially polarized radiation beam is used which has the effect of enhancing the image contrast.

Typically, the radiation beam may be more than about 50%, 60%, 70%, 80%, 90% or 85% polarized. Preferably, the radiation beam may be more than about 80% radially polarized.

Typically, using radially polarized on-axis illumination allows the image contrast to be improved thereby allowing dense features to be formed. The radial direction of the polarization direction may be achieved by positioning a polarization direction shaping element in the pupil plane of the illuminator of the lithographic apparatus. The polarization direction shaping element may consist of spatially separated elements that can change the direction of the E-field vector independently from each other. These elements may be retarding elements, optical active elements or polarizing elements. An important aspect of this polarization distribution is that it can be used (unlike x- or y-polarization) for both horizontal (H) and vertical (V) lines.

Using radially polarized illumination allows $k_1$ values down to less than about 0.5, 0.4, 0.3 or 0.28 (assuming that the minimal spot size in the pupil has a radius of 0.15) to be formed.

Typically, the radially polarized illumination may be of any suitable shape such as, for example, diamond, circular, star-shaped or rectangularly shaped on-axis illumination.

Typically, the first order may be clipped by a numerical aperture diaphragm with an amount of about 40%, 30% 20%, 10% or 5% being clipped. Conveniently, the first order may be clipped by about 5-40% or 10-20%. Preferably, the first order may be clipped by about 12.5%. This leads to an improvement in the image contrast. It is therefore preferable when using radial polarization that a small part of the spectrum falls outside the numerical aperture, as this will lead to an enhancement in the image contrast.

Typically, the numerical aperture may be tuned to enhance the image contrast with a value (depending on application, for instance immersion or dry) between about 5 and 30% (in absolute sense). In certain embodiments, the numerical aperture may comprise a variable numerical aperture diaphragm.

Typically, the radiation used in the lithographic apparatus may have a wavelength corresponding to that of Deep Ultra-Violet radiation (DUV). The radiation used may have a wavelength of between about 50-500 nm or about 100-400 nm. Preferred wavelengths are about 157 nm, 193 nm, 248 nm or 365 nm.

According to a yet further aspect of the present invention there is provided a device manufacturing method including providing a substrate, providing a conditioned radiation beam using an illumination system, imparting a pattern to the radiation beam, and projecting the patterned beam of radiation onto to a target portion of the substrate, wherein the radiation beam is substantially radially polarized which has the effect of enhancing the image contrast.

Typically, the radiation beam may be more than about 50%, 60%, 70%, 80%, 90% or 95% polarized. Preferably, the radiation beam may be more than about 80% radially polarized.

Typically, using radially polarized on-axis illumination allows the image contrast to be improved thereby allowing dense features to be formed. The radial direction of the polarization direction may be achieved by positioning a polarization direction shaping element in the pupil plane of the illuminator of the lithographic apparatus. The polarization direction shaping element may consist of spatially separated elements that can change the direction of the E-field vector independently from each other. These elements may be retarding elements, optical active elements or polarizing elements. An important aspect of this polarization distribution is that it can be used (unlike x- or y-polarization) for both horizontal (H) and vertical (V) lines.

Using radially polarized illumination allows $k_1$ values down to less than about 0.5, 0.4, 0.3 or 0.28 (assuming that the minimal spot size in the pupil has a radius of 0.15) to be formed.

Typically, the radially polarized illumination may be of any suitable shape such as, for example, diamond, circular, star-shaped or rectangularly shaped on-axis illumination.

Typically, the first order may be clipped by a numerical aperture diaphragm with an amount of about 40%, 30% 20%, 10% or 5% being clipped. Conveniently, the first order is clipped by about 5-40% or 10-20%. Preferably, the first order may be clipped by about 12.5%. This leads to an improvement in the image contrast. It is therefore preferable when using radial polarization that a small part of the spectrum falls outside the numerical aperture, as this will lead to an enhancement in the image contrast.

Typically, the numerical aperture may be tuned to enhance the image contrast with a value (depending on application, for instance immersion or dry) between about 5 and 30% (in absolute sense). Preferably, the numerical aperture may comprise a variable numerical aperture diaphragm.

Typically, the radiation used in the lithographic apparatus may have a wavelength corresponding to that of Deep Ultra-Violet radiation (DUV). The radiation used may have a wavelength of between about 50-500 nm or about 100-400 nm. Preferred wavelengths are about 157 nm, 193 nm, 248 nm or 365 nm.

According to a further aspect of the present invention, there is provided a device manufacturing method including projecting a patterned beam of radiation onto a substrate, wherein the radiation beam is substantially radially polarized.

Typically, the radiation beam may be more than about 50%, 60%, 70%, 80%, 90% or 85% polarized. In a particular embodiment, the radiation beam may be more than about 80% radially polarized.

Typically, using radially polarized on-axis illumination allows the image contrast to be improved thereby allowing dense features to be formed. The radial direction of the polarization direction may be achieved by positioning a polarization direction shaping element in the pupil plane of the illuminator of the lithographic apparatus. The polarization direction shaping element may consist of spatially separated elements that can change the direction of the E-field vector independently from each other. These elements may be retarding elements, optical active elements or polarizing elements. An important aspect of this polarization distribution is that it can be used (unlike x- or y-polarization) for both horizontal (H) and vertical (V) lines.

Using radially polarized illumination allows $k_1$ values down to less than about 0.5, 0.4, 0.3 or 0.28 (assuming that the minimal spot size in the pupil has a radius of 0.15) to be formed.

Typically, the radially polarized illumination may be of any suitable shape such as, for example, diamond, circular, star-shaped or rectangularly shaped on-axis illumination.

Typically, the first order may be clipped by a numerical aperture diaphragm with an amount of about 40%, 30% 20%, 10% or 5% being clipped. Conveniently, the first order is clipped by about 5-40% or 10-29%. Preferably, the first order may be clipped by about 12.5%. This leads to an improvement in the image contrast. It is therefore preferable when using radial polarization that a small part of the spectrum falls outside the numerical aperture, as this will lead to an enhancement in the image contrast.

Typically, the numerical aperture may be tuned to enhance the image contrast with a value (depending on application, for instance immersion or dry) between about 5 and 30% (in absolute sense). Preferably, the numerical aperture may comprise a variable numerical aperture diaphragm.

Typically, the radiation used in the lithographic apparatus may have a wavelength corresponding to that of Deep Ultra-Violet radiation (DUV). The radiation used may have a wavelength of between about 50-500 nm or about 100-400 nm. Preferred wavelengths are about 157 nm, 193 nm, 248 nm or 365 nm.

According to a further aspect of the present invention there is provided a device manufactured by a method including projecting a patterned beam of radiation onto a substrate, wherein the radiation beam is substantially radially polarized which has the effect of improving the image contrast.

Typically, the radiation beam may be more than about 50%, 60%, 70%, 80%, 90% or 85% polarized. In particular, the radiation beam may be more than about 80% radially polarized.

Typically, using radially polarized on-axis illumination allows the image contrast to be improved thereby allowing dense features to be formed. The radial direction of the polarization direction may be achieved by positioning a polarization direction shaping element in the pupil plane of the illuminator of the lithographic apparatus. The polarization direction shaping element may consist of spatially separated elements that can change the direction of the E-field vector independently from each other. These elements may be retarding elements, optical active elements or polarizing elements. An important aspect of this polarization distribution is that it can be used (unlike x- or y-polarization) for both horizontal (H) and vertical (V) lines.

Using radially polarized illumination allows $k_1$ values down to less than about 0.5, 0.4, 0.3 or 0.28 (assuming that the minimal spot size in the pupil has a radius of 0.15) to be formed.

Typically, the radially polarized illumination may be of any suitable shape such as, for example, diamond, circular, star-shaped or rectangularly shaped on-axis illumination.

Typically, the first order may be clipped by a numerical aperture diaphragm with an amount of about 40%, 30% 20%, 10% or 5% being clipped. Conveniently, the first order may be clipped by about 5-40% or 10-29%. Preferably, the first order is clipped by about 12.5%. This leads to an improvement in the image contrast. It is therefore preferable when using radial polarization that a small part of the spectrum falls outside the numerical aperture, as this will lead to an enhancement in the image contrast.

Typically, the numerical aperture may be tuned to enhance the image contrast with a value (depending on application, for instance immersion or dry) between about 5 and 30% (in absolute sense). In particular, the numerical aperture may comprise a variable numerical aperture diaphragm.

Typically, the radiation used in the lithographic apparatus may have a wavelength corresponding to that of Deep Ultra-Violet radiation (DUV). The radiation used may have a wavelength of between about 50-500 nm or about 100-400 nm. Preferred wavelengths are about 157 nm, 193 nm, 248 nm or 365 nm.

The manufactured device may, for example, be integrated circuits (ICs), integrated optical systems, guidance and detection patterns for magnetic domain memories, liquid crystal displays (LCDs) and thin-film magnetic heads.

BRIEF DESCRIPTION OF THE DRAWINGS

Embodiments of the present invention will now be described, by way of example only, with reference to the accompanying schematic drawings in which corresponding symbols indicate corresponding parts, and in which.

DETAILED DESCRIPTION

Figure 1:
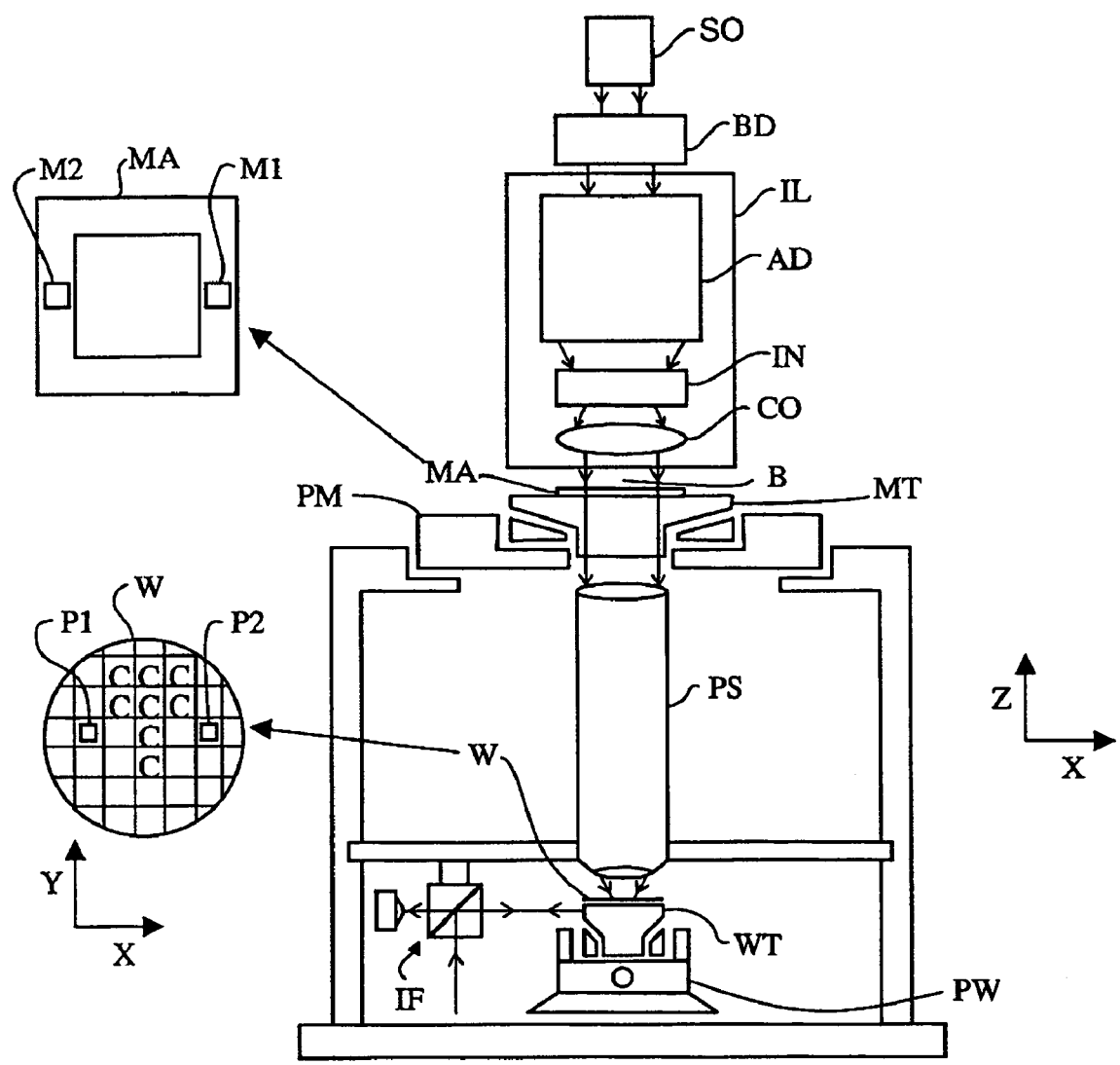
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator EL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

It has been found that when imaging Phase Shift Mask (PSM) structures and the pitch of the PSM features become smaller, such as less than the wavelength divided by twice the numerical aperture, then a portion of the first order of the diffraction falls outside the numerical aperture and the image contrast decreases rapidly.

The present invention relates to using more than about 80% radially polarized on-axis sources and tuning the numerical aperture (NA) to enhance the image contrast.

The radial direction of the polarization is achieved by positioning a polarizing optical element, i.e., a polarizer or a combination of polarizing optical elements, in the pupil plane of a lithographic apparatus. In a particular embodiment, the polarizing optical element consists of spatially separated elements that change the direction of the E-field vector independently from each other. These elements are any of retarding elements, optical active elements or polarizing elements. This allows for both horizontal (H) and vertical (V) lines. Using radial polarization allows $k_1$ values down to about 0.28 (assuming that the minimal spot size in the pupil has a radius of 0.15). On the other hand, the radiation source itself may be a source of radially polarized light, eliminating the need for additional polarizing optical elements.

It should be noted that polarized on-axis sources behave similarly to un-polarized sources when imaging PSM features for which the orders are captured entirely.

It has been found that it is advantageous to use radially polarized on-axis illumination when the pitch of the features becomes small enough to cause clipping of the first orders with a numerical aperture diaphragm.

Figure 2:
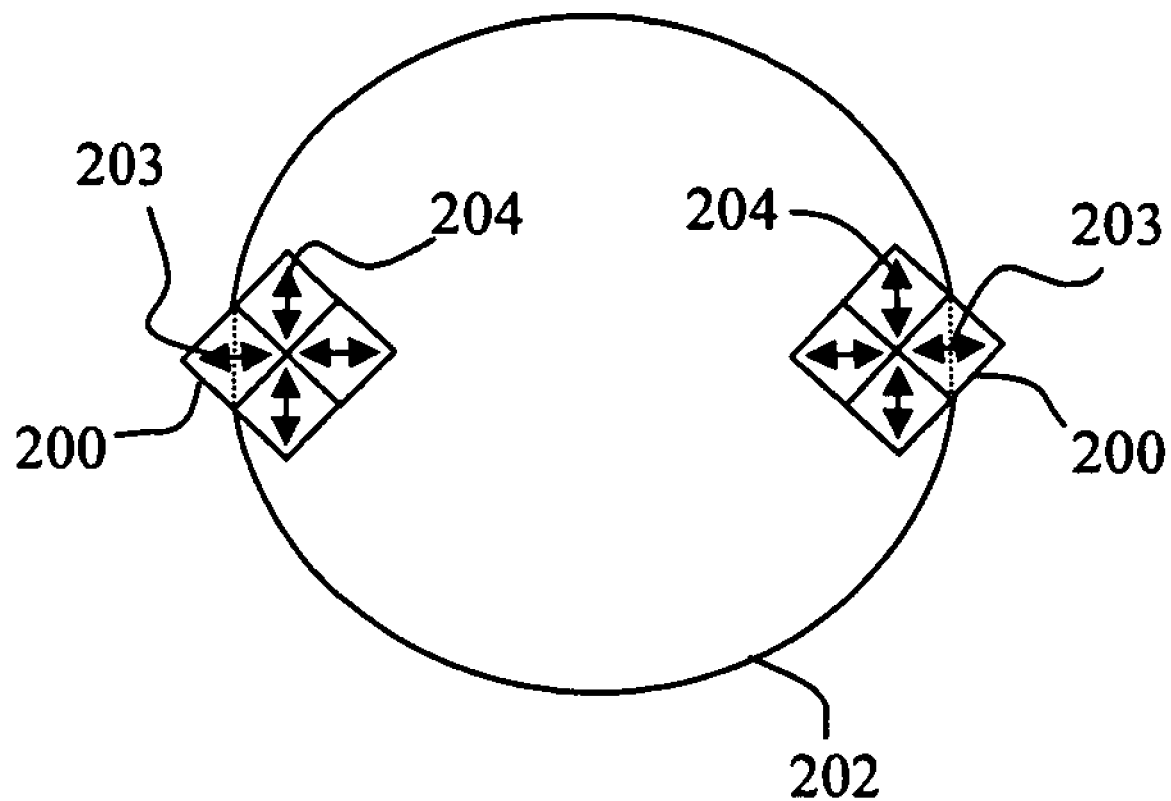
FIG. 2 depicts radially polarized illumination representing clipping according to an embodiment of the invention.

FIG. 3 relates to radially polarized illumination in the present invention where about 12.5% clipping of the first order of the diffraction occurs with the numerical aperture diaphragm. Clipping occurs as not all of the first order is captured. In FIG. 2, which illustrates the clipping, in a pupil of the projection system, of first order diffracted radiation 200, the radius of the circle 202 refers to an area beyond which the first order radiation 200 is clipped. For example, the circle 202 may represent the edge of a numerical aperture diaphragm in the projection system. The arrows 203 represent radially polarized radiation, and the arrows 204 indicate tangentially polarization. The clipping of radiation concerns clipping of a portion of the radially polarized radiation, as illustrated in FIG. 2.

It has been found that by actively tuning the numerical aperture for specific pitches, that the image contrast can be improved. At the same time the Depth Of Focus increases due to the clipping. Significantly, equal improvement is obtained for both Horizontal (H) and Vertical (V) lines.

When orders of the diffraction are clipped and thereby only partially captured, it has been found that radially polarized light gives better performance than unpolarized light i.e. this enhances the image contrast by about 10-20%.

It has also been found that the exposure latitude improvement is proportional to the improvement in contrast. For example, if the contrast improves by about 10%, then the exposure latitude will improve also by about 10%. In particular, in the present invention a 7% improvement may be obtained for 60 nm dense lines.

Figure 3A:
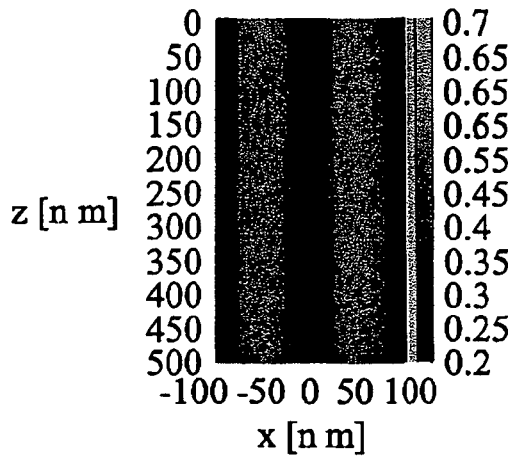
FIGS. 3a-3c depict aerial images for alternating phase shift mask (alt-PSM) with a diamond illumination according to an embodiment of the invention.
Figure 3B:
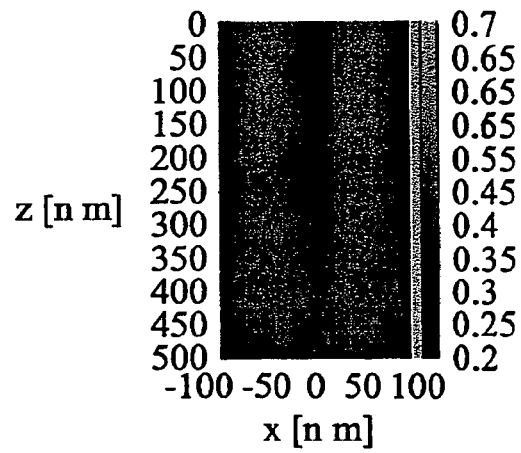
Figure 3C:
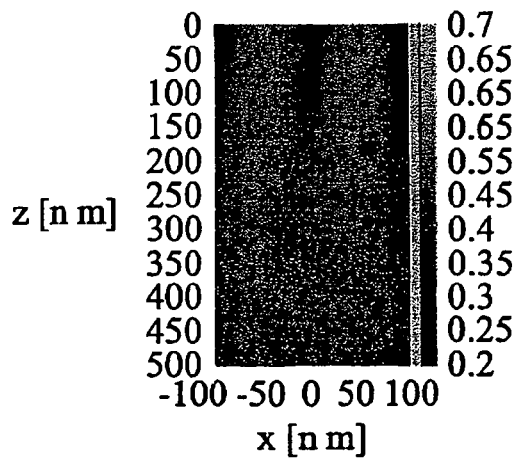

FIGS. 3a-3c relate to aerial images for an alternating phase shift mask (alt-PSM) with a diamond illumination. The parameters for the aerial images shown in FIGS. 3a-3c are as follows: λ (i.e. wavelength)=193 nm; NA (i.e. numerical aperture)=0.93 for the clipped case; chrome width=55.5 nm; p (i.e. pitch) in FIGS. 3a and 3b=111 nm and in FIG. 3c, NA=1 and the area of the diamond is the same as conventional σ=0.1 (fully captured case). It is clear from the Figures that the Depth Of Focus is better when the orders are clipped. Moreover the contrast numbers in best focus (shown in the title of the pictures) is 25% better for radially polarized (in absolute sense) than for the same case unpolarized. It is also clear that the contrast outperforms by 21% (in absolute sense) the contrast when the lithographic apparatus were to have a larger NA of 1.

FIG. 3a relates to the configuration as shown in FIG. 2 where radially polarized radiation is used and partial clipping of the first order occurs with a numerical aperture.

FIG. 3b is an aerial image where unpolarized light is used with a diamond illumination.

FIG. 3c is an aerial image where unpolarized light is used and the first order is just inside the numerical aperture. There is thus no clipping of the first order of diffraction in this situation.

It is clear from FIGS. 3a-3c that the Depth Of Focus (DOF) for radially polarized light as shown in FIG. 3a is larger than for the configurations in FIGS. 3b and 3c.

FIGS. 4, 5, 6a and 6b relate to different radially polarized illumination shapes which may be used in the present invention.

Figure 4:
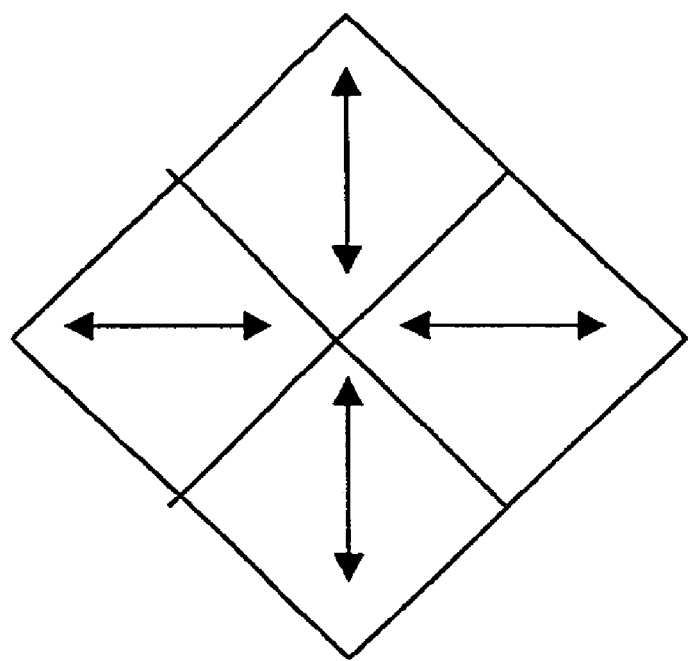
FIGS. 4, 5, 6a and 6b depict different configurations for use with radially polarized illumination according to embodiments of the invention.

FIG. 4 relates to radially polarized diamond shaped on-axis illumination. Preferably poles with minimum size are used (as limited by the maximum allowable intensity density).

Figure 5:
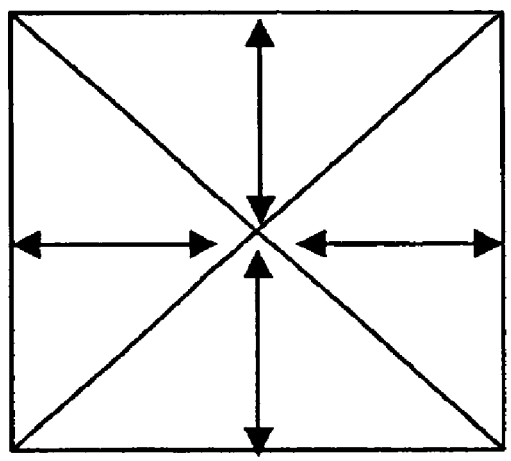

FIG. 5 relates to radially polarized rectangular shaped on-axis illumination.

Figure 6A:
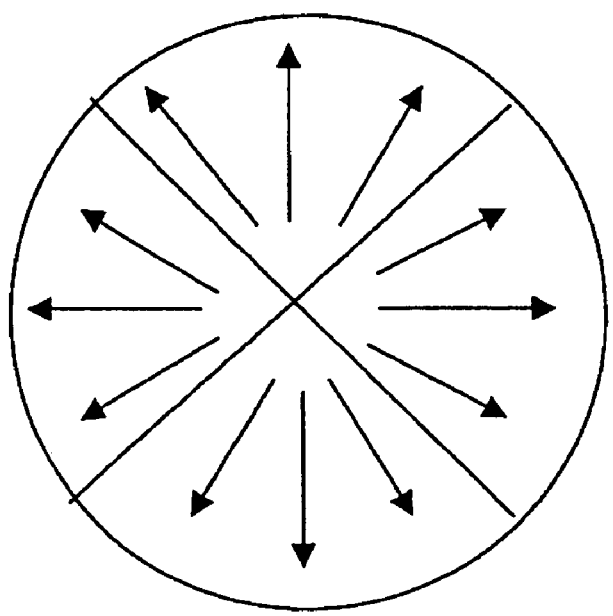
Figure 6B:
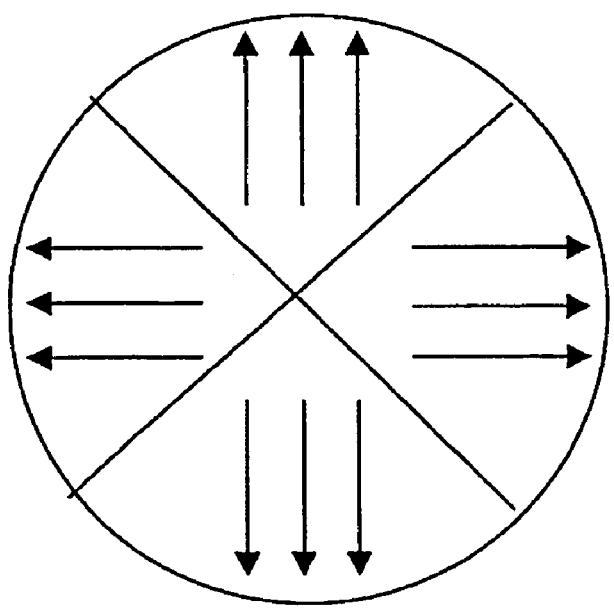

FIGS. 6a and 6b relate to radially polarized circularly shaped on-axis illumination. Also shown are different degrees of radial polarization. FIG. 6a relates to a degree close to 1. FIG. 6b relates to a degree of about 0.9.

It has been found that radially polarized pupil shaped configurations give better contrast when the orders are partially obscured (i.e. clipped) by about 12.5% by the numerical aperture diaphragms.

Figure 7:
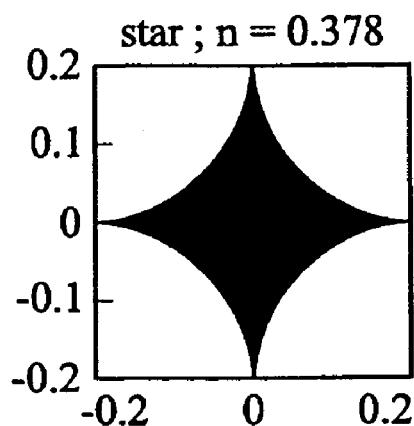
FIG. 7 depicts illumination shapes according to embodiments of the invention.
Figure 7:
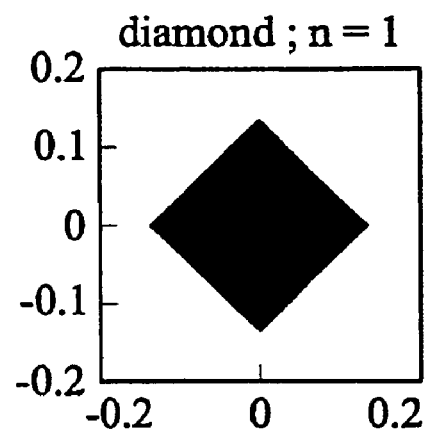
Figure 7:
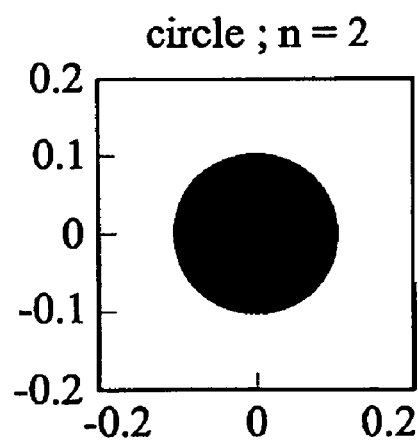
Figure 7:
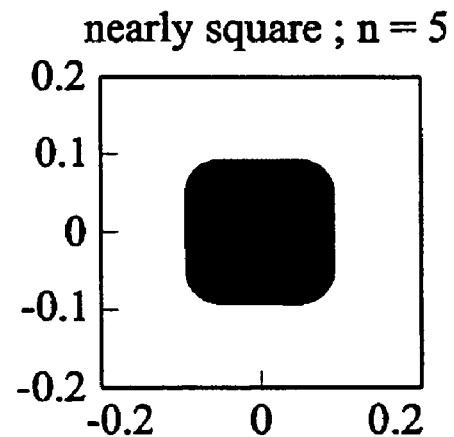

FIG. 7 relates to further illumination shapes. All of the shapes in FIG. 7 are special cases of the form $(x^n+y^n)^{1/n}$=constant. The area is kept the same. It can be shown that an n somewhat smaller than 1 performs better (optimum is n=0.38).

EXAMPLE

To verify the merits of radially polarized illumination in enhancing image contrast a contrast simulator program was used.

This example relates to a specific situation where there is a contrast reversal (in air) for TM polarization. The example is for an alt-PSM provided with a 60 nm dense line structure with conventional illumination, a pupil filling factor (i.e. σ) equivalent to 0.2 for an apparatus with a numerical aperture of 0.93.

Figure 8:
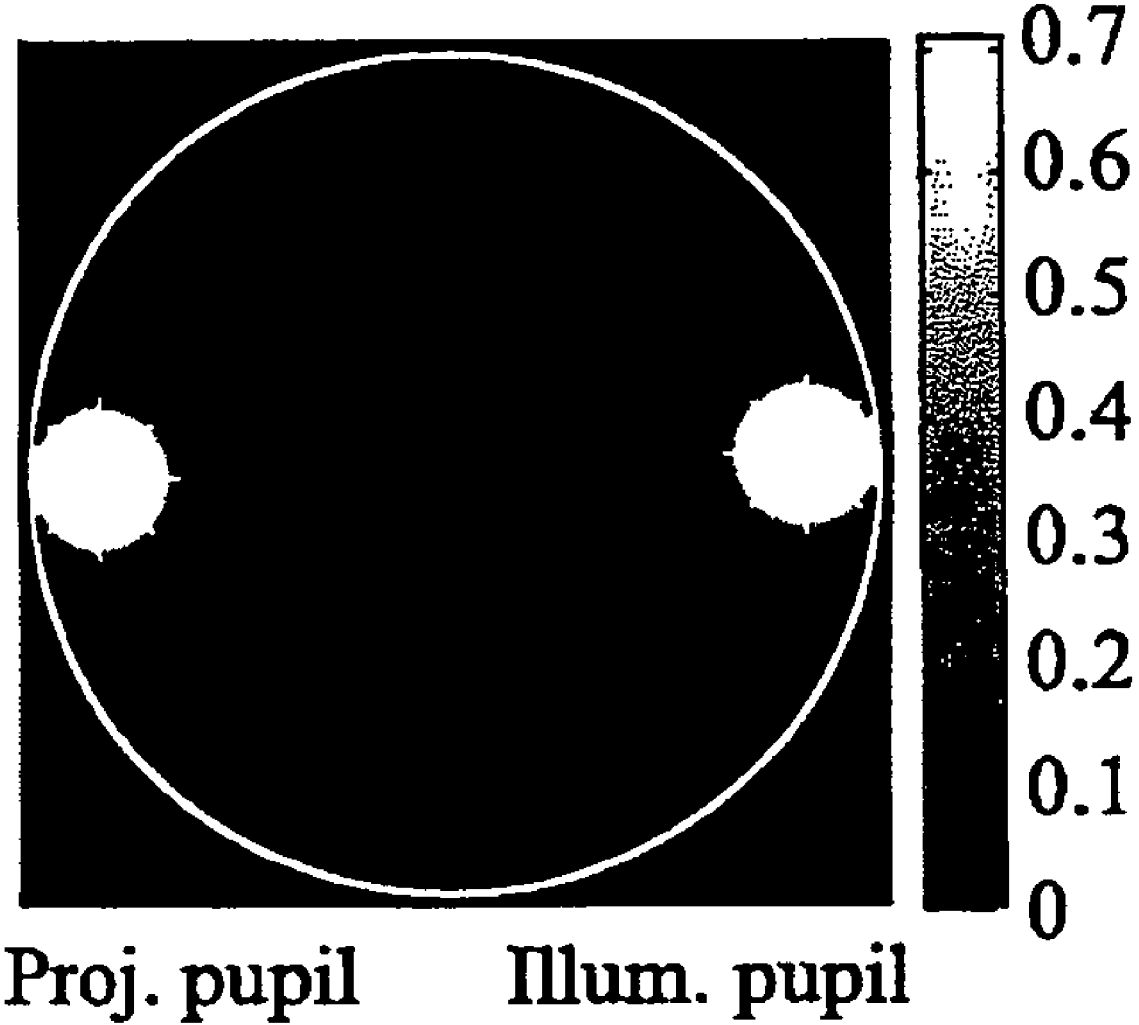
FIG. 8 depicts pupil filling for a 60 nm dense alternating phase shift mask (alt-PSM) structure with conventional illumination according to an embodiment of the invention.

FIG. 8 relates to pupil filling for a simulation for a 60 nm alternating phase shift mask (alt-PSM) line structure.

FIGS. 9a-9d represent the intensity profiles for a line across the pupil filling shown in FIG. 8.

Figure 9A:
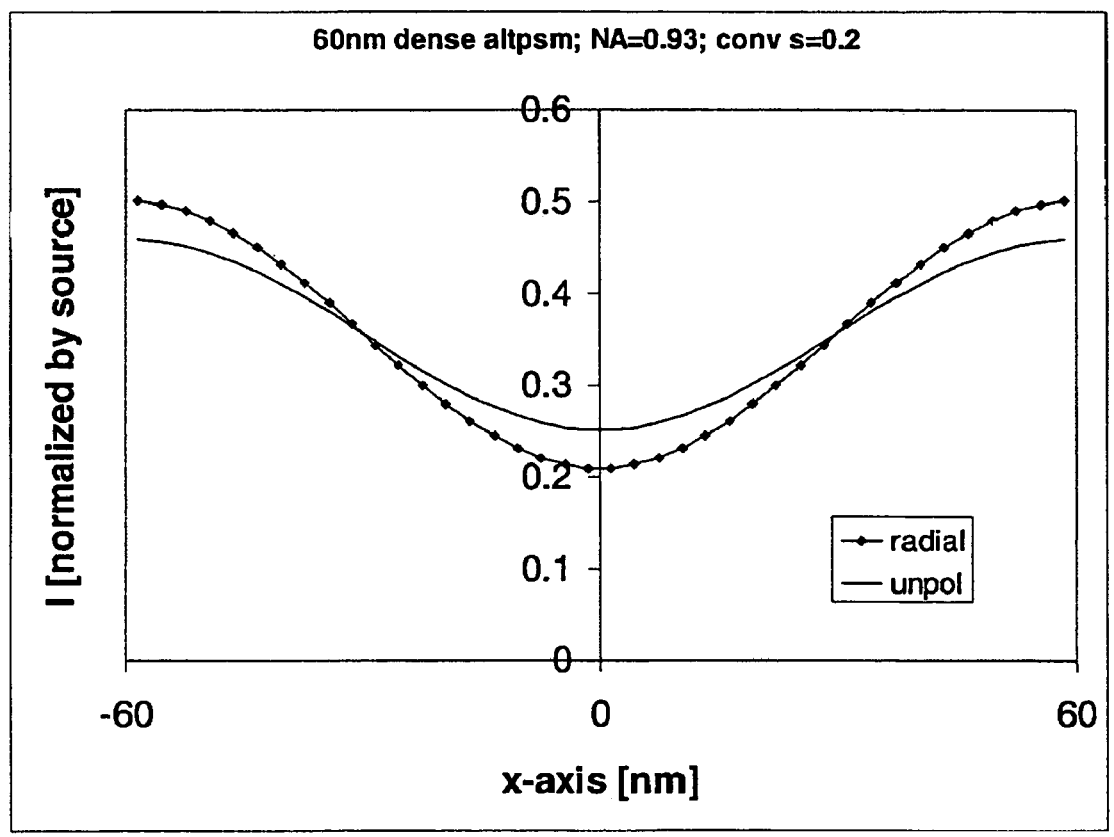
FIGS. 9a-9d depict intensity profiles for alternating phase shift mask dense 60 nm lines according to an embodiment of the invention.
Figure 9B:
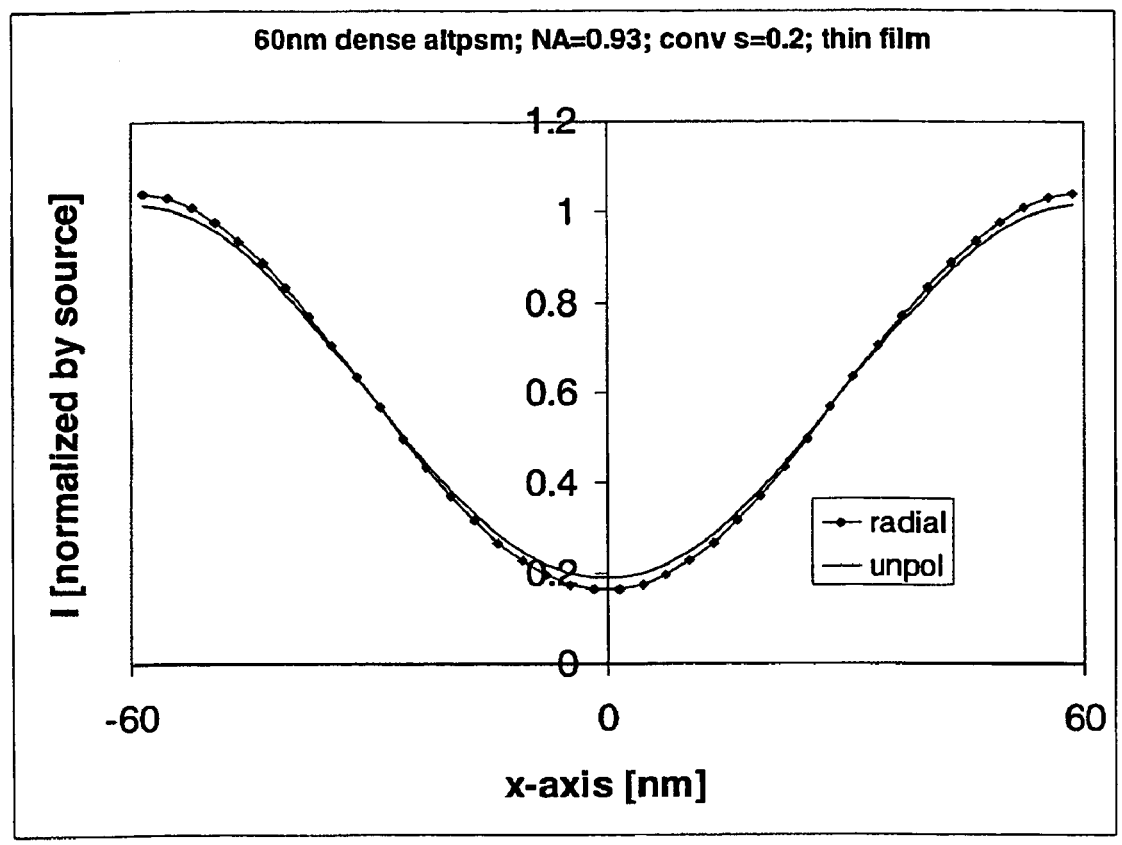
Figure 9C:
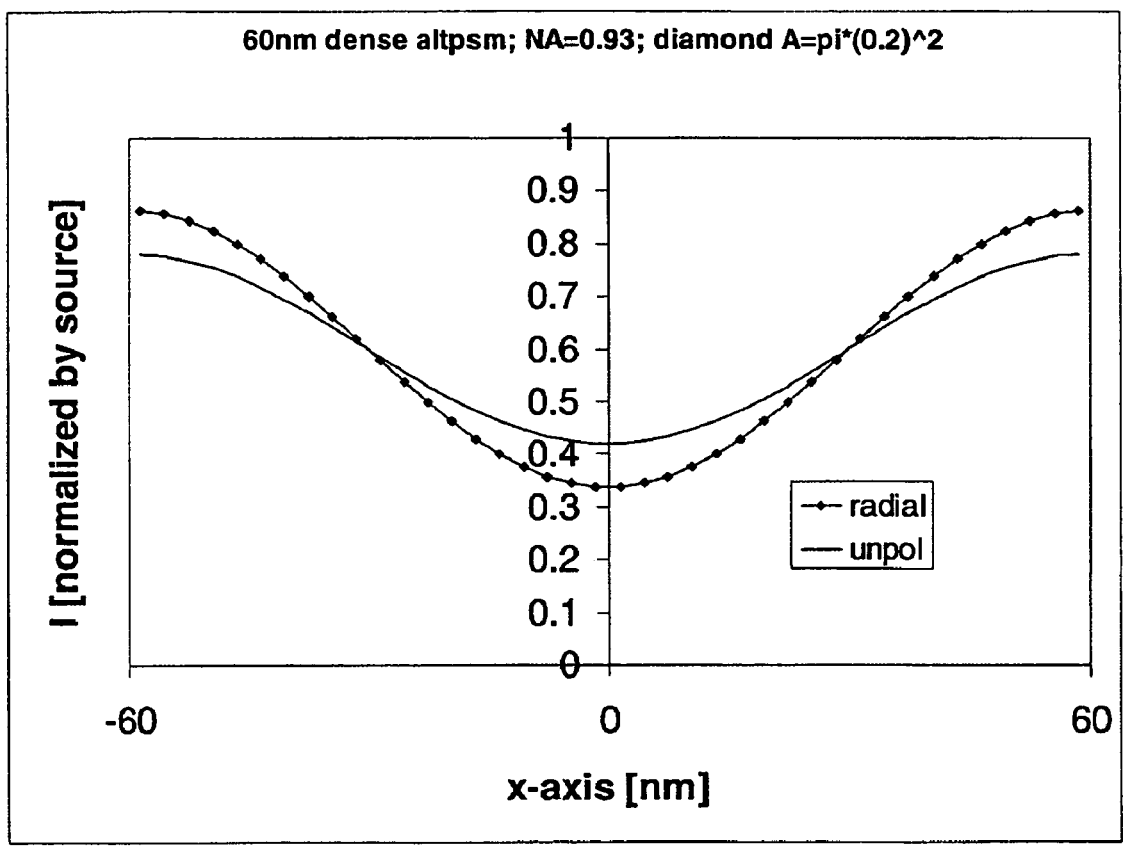

FIGS. 9a and 9c are plots of an intensity in air.

Figure 9D:
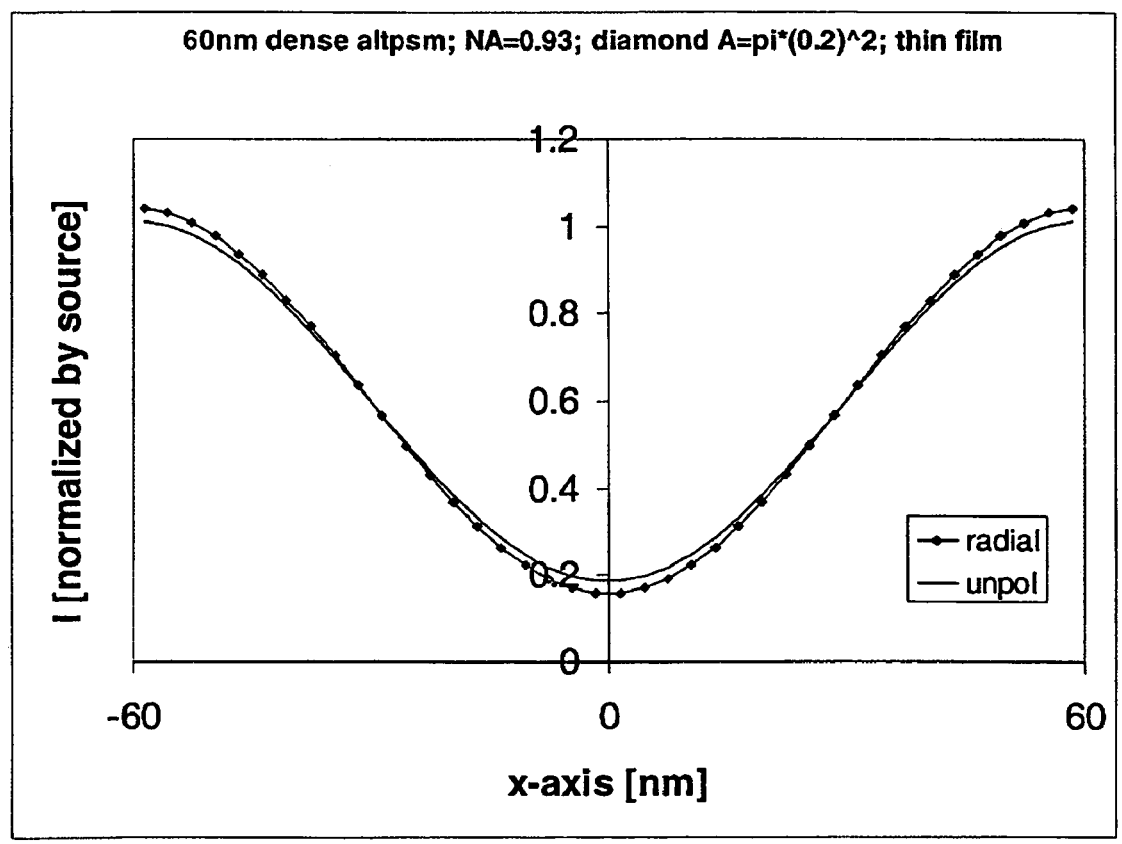

FIGS. 9b and 9d are plots of an intensity in a thin film with a refractive index (n) equal to 1.7.

FIGS. 9a and 9b illustrate intensity plots whereby conventional illumination is used and FIGS. 9c and 9d illustrate intensity plots whereby a diamond structure illumination with the same area is used.

In this situation, it is better to have radially or unpolarized illumination than the azimuthal illumination in air as shown in FIGS. 9a and 9c. This is also the case for the thin film where the effects of the change in angle of the diffracted waves and the differences in the Fresnel reflection coefficients for different polarization states are taken into account. However, in the thin film situation as shown in FIGS. 9b and 9d, the differences become much smaller and the reversal in TM polarization is absent. This is because the angle between the $-1^{st}$ and $+1^{st}$ order gets smaller than 90° in the thin film.

The advantage of radial polarization here is that when a smaller portion of the first diffraction orders falls outside the numerical aperture, it is the part of the first diffraction orders with undesirable polarization direction that falls outside the aperture stop, so that the contrast is not so much effected. The filtered part of the first diffraction orders has a polarization state that is undesirable for imaging as it is polarized perpendicular to the feature orientation.

From FIGS. 9a-9d it can be seen that the diamond illumination of FIGS. 9c and 9d has a better performance than for x- or y-polarization. In addition, it is clear that radial polarization in combination with a diamond illumination is better for structures when the spectrum is partly outside the numerical aperture (i.e. there is clipping). This is because in relative terms more of the 'bad' polarization is lost.

Table 1 shown below is a table of values for conventional and diamond illumination as shown in FIGS. 9a-9d. The different contrast for air and thin film is shown along with the respective x- and y-polarization, the azimuthal polarization and the radial and unpolarized radiation.

TABLE 1

| Illumination | Contrast | y-polarization | x-polarization | Azimuthal polarization | Full Radial polarization | unpolarized | Unpolarized NA = 1 |
|---|---|---|---|---|---|---|---|
| Conventional | Air | 0.864 | −0.258 | 0.178 | 0.409 | 0.293 | |
| | Thin Film | 0.883 | 0.487 | 0.644 | 0.727 | 0.685 | |
| Diamond | Air | 0.879 | −0.432 | 0.163 | 0.436 | 0.300 | 0.301 |
| | Thin Film | 0.884 | 0.488 | 0.637 | 0.735 | 0.686 | 0.719 |

It is clear from Table 1 that the radial polarization is better than the unpolarized situation when a small part of the spectrum falls outside the numerical aperture.

It is also clear that the diamond illumination in combination with radial polarization out performs that of conventional illumination.

Therefore, by using diamond illumination in combination with radial polarization, the resolution can be pushed further than with the conventional mode.

Figure 10:
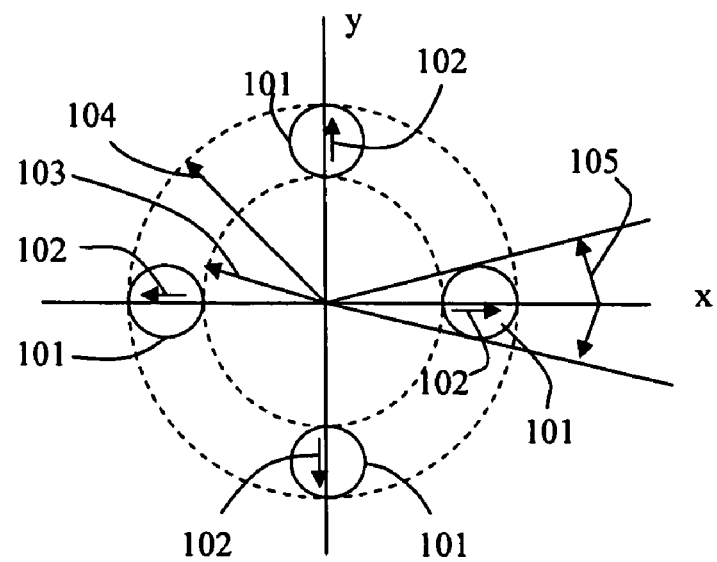
FIG. 10 illustrates a radially polarized cross quadrupole illumination configuration according to an embodiment of the present invention.
Figure 11:
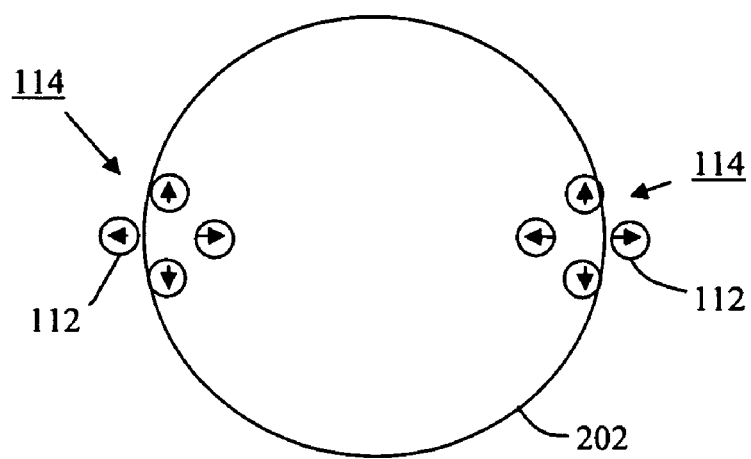
FIG. 11 illustrates the position of first order diffracted beams in the pupil of the projection system, using cross quadrupole illumination in accordance with an embodiment of the invention.
Figure 12:
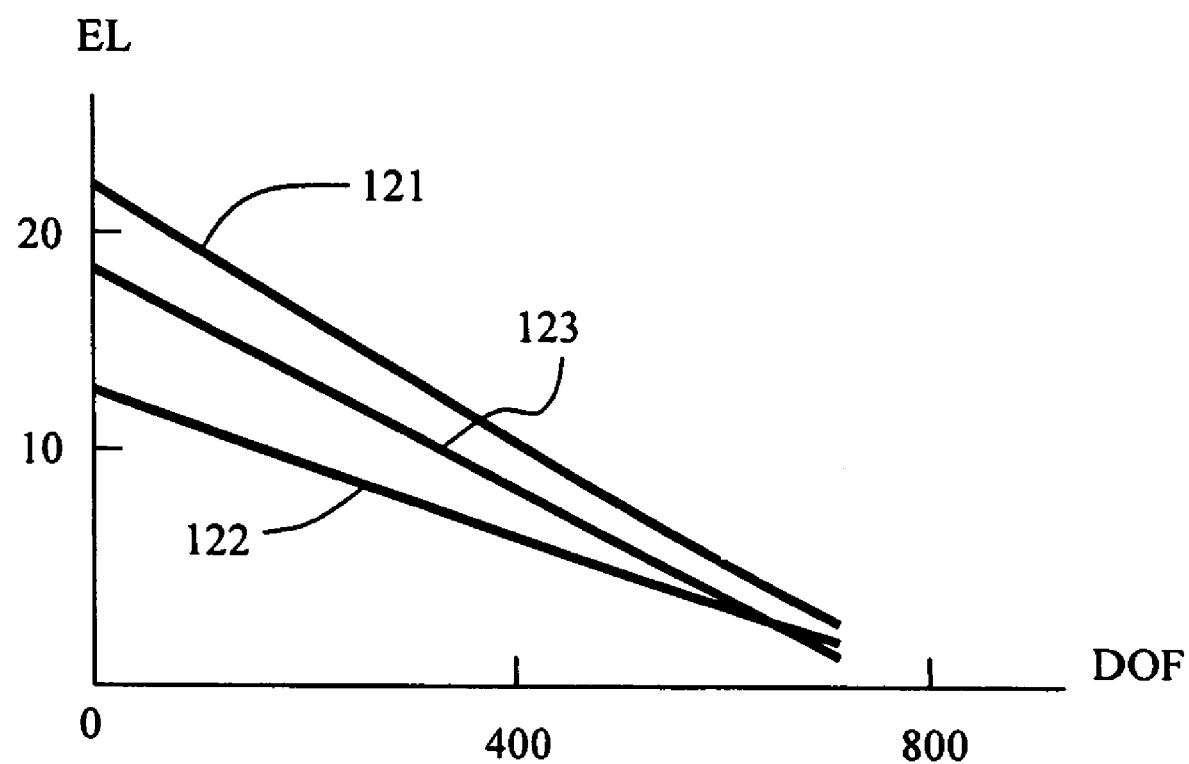
FIG. 12 illustrates plots of exposure latitude expressed as percentage, versus depth of focus in nm, for a process whereby dense lines of a given line width are printed using cross quadrupole illumination.

According to an aspect of the invention an alt-PSM, for example patterned to image a pattern of dense lines, is illuminated with a cross quadrupole illumination mode. The cross quadrupole illumination mode is illustrated in FIG. 10; radiation in each of the poles 101 is radially polarized, as illustrated by the arrows 102 in FIG. 10. Any cross quadrupole illumination mode is characterized by a radiation intensity distribution in a pupil of the illumination system centered with respect to the optical axis of the illumination system, and comprising off-axis areas of relative high intensity on the x and y axes, embedded in an area of relative low intensity. As is further illustrated in FIG. 10, a shape of the poles may be characterized by a normalized inner radius 103 of the poles, a normalized outer radius 104, and an opening angle 105. In the present embodiment, and as illustrated in FIG. 11, the pitch of the dense lines is chosen such that, taking account of the wavelength of the illumination radiation, a part 112 of the first order diffracted radiation beams 114 (as emanating from the illuminated area of the alt-PSM) is blocked by an edge 202 of the numerical aperture diaphragm of the projection system, in analogy with the embodiments described above. The radial polarization of the poles upstream of the reticle is indicated by the arrows drawn inside the poles. After diffraction at said pattern of dense lines, the content of radially polarized radiation in the pupil of the projection system decreases (due to the blocking of radiation), causing an improvement of image contrast and depth of focus over a lithographic process involving the use of an alt-PSM with conventional on axis illumination. In FIG. 12 the process improvement is illustrated, using calculated plots of exposure latitude EL (expressed as a percentage) against the corresponding depth of focus DOF in nm, for a given line width of 45 nm of the lines of a pattern of dense lines (arranged at a pitch of 90 nm). The plots are calculated assuming the a numerical aperture 1.3 of the projection system, and a refractive index 1.7 of the resist layer. In the present embodiment the inner normalized radius 103 of the poles is 0.2, the outer normalized radius 104 is 0.45, and the opening angle 105 is 20 degrees. Plot 121 represents the results for the present embodiment, whereby the radiation within the poles is radially polarized. Plot 122 represents the exposure latitude versus DOF results for the same embodiment, safe that the radiation of the poles 101 is unpolarized. Plot 123 represents the exposure latitude versus DOF results for a conventional process, using instead of cross quadrupole illumination, conventional on-axis unpolarized illumination. Blocking part of the radially polarized, diffracted radiation during imaging (for example using off axis illumination) at a location downstream of the patterning device leads to an improved process window, as shown in FIG. 12. An improvement of process window as shown in FIG. 12 and as obtained with the present embodiment, is, according to the present invention, obtainable for any value of the normalized inner radius 103 between 0.2 and 0.35, in combination with any value of the difference between the outer and inner normalized radius between 0.2 and 0.3.

According to an aspect of the invention, the above described radially polarized cross quadrupole illumination is combined with a radially polarized, conventional on-axis illumination mode to further enhance the obtainable depth of focus whilst maintaining sufficient image contrast.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   an illumination system configured to condition a radiation beam;
   a support configured to support a patterning device, the patterning device being configured to impart the radiation beam with a pattern in its cross-section;
   a substrate table configured to hold a substrate; and
   a projection system having a diaphragm and configured to project the radiation beam, after it has been patterned, onto a target portion of the substrate;
   wherein, in use, the radiation beam illuminating the patterning device is substantially radially polarized and wherein the diaphragm is configured to block a radially polarized diffracted portion of the patterned radiation, the blocked radially polarized diffracted portion of the patterned radiation comprising at least about 5% of a first order diffraction pattern.

2. A lithographic apparatus according to claim 1, wherein, in use, the radiation beam is radially polarized substantially at a pupil plane of the illumination system.

3. A lithographic apparatus according to claim 1, wherein, in use, the radiation beam is radially polarized at its source.

4. A lithographic apparatus according to claim 1, wherein, in use, the radiation beam is more than about 80% radially polarized.

5. A lithographic apparatus according to claim 1, wherein, in use, the radial polarization is obtained by a polarizing optical element in a pupil plane of the illumination system.

6. A lithographic apparatus according to claim 5, wherein the polarizing optical element is configured to change the direction of the E-field vector.

7. A lithographic apparatus according to claim 1, wherein a configuration of the radially polarized illumination is any of a diamond shaped on-axis illumination configuration, a circular shaped on-axis illumination configuration, a star shaped on-axis illumination configuration, a rectangularly shaped on-axis illumination configuration, or a multipole shaped off-axis illumination configuration.

8. A lithographic apparatus according to claim 1, wherein the blocked radially polarized diffracted portion of the patterned radiation comprises 12.5% of the first order diffraction pattern.

9. A lithographic apparatus according to claim 1, wherein the diaphragm is a variable numerical aperture.

10. A lithographic apparatus according to claim 1, wherein, in use, the radiation used in the lithographic apparatus has a wavelength of about 157 nm, about 193 nm, about 248 nm or about 365 nm.

11. A device manufacturing method comprising:
radially polarizing a beam of radiation;
patterning the beam of radiation;
blocking a radially polarized diffracted portion of the patterned radiation, the blocked radially polarized diffracted portion of the patterned radiation comprising at least about 5% of a first order diffraction pattern; and
projecting the beam of radiation, after it has been patterned, onto a target portion of a substrate.

12. A method according to claim 11, wherein the radially polarizing further comprises producing the beam of radiation with a substantially radial polarization.

13. A method according to claim 11, wherein the radially polarizing further comprises radially polarizing the beam of radiation prior to the patterning.

14. A method according to claim 11, wherein the radiation beam is more than about 80% radially polarized.

15. A method according to claim 11, further comprising: positioning a polarizing optical element in a pupil plane of an illumination system of a lithographic apparatus used in the method to form the beam of substantially radially polarized radiation.

16. A method according to claim 11, wherein the polarizing optical element changes the direction of the E-field vector.

17. A method according to claim 11, wherein a projection system for projecting the beam of radiation comprises a diaphragm that accomplishes the blocking of the radially polarized diffracted portion of the patterned radiation.

18. A method according to claim 11, wherein using radially polarized illumination allows k1 values down to about 0.28 to be formed.

19. A method according to claim 11, wherein a configuration of the radially polarized illumination is any of a diamond shaped on-axis illumination configuration, a circular shaped on-axis illumination configuration, a star shaped on-axis illumination configuration, a rectangularly shaped on-axis illumination configuration or a multipole shaped off-axis illumination configuration.

20. A method according to claim 11, wherein the blocked radially polarized diffracted portion of the patterned radiation comprises 12.5% of the first order diffraction pattern.

21. A method according to claim 17, wherein the diaphragm is a numerical aperture diaphragm and is tuned to enhance the image contrast.

22. A method according to claim 11, wherein the radiation used in the lithographic apparatus has a wavelength of about 157 nm, about 193 nm, about 248 nm and about 365 nm.

23. A device manufacturing method comprising:
providing a substrate;
providing a conditioned radiation beam using an illumination system;
imparting a pattern to the radiation beam;
substantially radially polarizing the radiation beam to enhance image contrast;
blocking a radially polarized diffracted portion of the patterned radiation, the blocked radially polarized diffracted portion of the patterned radiation comprising at least about 5% of a first order diffraction pattern; and
projecting the patterned beam of radiation onto a target portion of the substrate.

24. A device manufacturing method according to claim 23, wherein the radiation beam is more than about 80% radially polarized.

25. A device manufacturing method according to claim 23, wherein the radially polarizing further comprises positioning a polarizing optical element in a pupil plane of the illumination system.

26. A device manufactured according to a method of:
projecting a patterned beam of radiation onto a substrate;
wherein the radiation beam is substantially radially polarized which has the effect of improving the image contrast and a radially polarized diffracted portion of the patterned radiation is blocked, the blocked radially polarized diffracted portion of the patterned radiation comprising at least about 5% of a first order diffraction pattern.

27. A device manufactured according to claim 26, wherein the manufactured device is any of the following: an integrated circuit, an integrated optical system, a guidance and detection pattern for a magnetic domain memory, a liquid crystal display or a thin-film magnetic head.

28. A lithographic apparatus according to claim 1, wherein the blocked radially polarized diffracted portion of the patterned radiation comprises an amount selected from between about 5% and about 40% of the first order diffraction pattern.

29. A lithographic apparatus according to claim 1, wherein the blocked radially polarized diffracted portion of the patterned radiation comprises an amount selected from between about 10% and about 20% of the first order diffraction pattern.

30. A method according to claim 11, wherein the blocked radially polarized diffracted portion of the patterned radiation comprises an amount selected from between about 5% and about 40% of the first order diffraction pattern.

31. A method according to claim 11, wherein the blocked radially polarized diffracted portion of the patterned radiation comprises an amount selected from between about 10% and about 20% of the first order diffraction pattern.

32. A method according to claim 23, wherein the blocked radially polarized diffracted portion of the patterned radiation comprises an amount selected from between about 5% and about 40% of the first order diffraction pattern.

33. A method according to claim 23, wherein the blocked radially polarized diffracted portion of the patterned radiation comprises an amount selected from between about 10% and about 20% of the first order diffraction pattern.

* * * * *